United States Patent
Dür et al.

(10) Patent No.: US 12,009,248 B2
(45) Date of Patent: Jun. 11, 2024

(54) PIN LIFTING DEVICE

(71) Applicant: VAT Holding AG, Haag (CH)

(72) Inventors: Michael Dür, Hohenweiler (AT); Rico Rohner, Widnau (CH); Adrian Eschenmoser, Grabs (CH); Marco Apolloni, Marbach (CH)

(73) Assignee: VAT HOLDING AG, Haag (CH)

( * ) Notice: Subject to any disclaimer, the term of this patent is extended or adjusted under 35 U.S.C. 154(b) by 599 days.

(21) Appl. No.: 17/276,744

(22) PCT Filed: Sep. 16, 2019

(86) PCT No.: PCT/EP2019/074610
§ 371 (c)(1),
(2) Date: Mar. 16, 2021

(87) PCT Pub. No.: WO2020/058150
PCT Pub. Date: Mar. 26, 2020

(65) Prior Publication Data
US 2022/0044957 A1    Feb. 10, 2022

(30) Foreign Application Priority Data
Sep. 17, 2018    (DE) .................... 10 2018 007 307.7

(51) Int. Cl.
*H01L 21/687*    (2006.01)
(52) U.S. Cl.
CPC .............. *H01L 21/68742* (2013.01)
(58) Field of Classification Search
CPC ..... H01L 21/68742; B25B 1/18; B25B 5/061; B25B 5/062; B25B 5/064
USPC ......... 269/20, 21, 24, 27, 32, 53, 54.1, 54.2, 269/54.3, 54.4, 201
See application file for complete search history.

(56) References Cited

U.S. PATENT DOCUMENTS

| 4,701,081 | A | 10/1987 | Hitoshi et al. |
| 5,158,268 | A | 10/1992 | Schnitzius et al. |
| 6,217,292 | B1 | 4/2001 | Masaki et al. |
| 6,305,667 | B1 | 10/2001 | Heller |
| 6,305,677 | B1 * | 10/2001 | Lenz ............... H01L 21/6831 269/21 |

(Continued)

FOREIGN PATENT DOCUMENTS

| CN | 101178502 A | 5/2008 |
| EP | 2354619 A2 | 8/2011 |

(Continued)

*Primary Examiner* — Lee D Wilson
*Assistant Examiner* — Alberto Saenz
(74) *Attorney, Agent, or Firm* — Muncy, Geissler, Olds & Lowe, P.C.

(57) ABSTRACT

Disclosed is a pin lifting device which includes a housing extending along an adjustment axis, a housing end at a first end region of the housing and has a housing opening, a drive part arranged at a second end region of the housing, an adjusting device having a part which can move in the housing in the direction of the adjustment axis, a guide section for the adjusting device formed on the inside of the housing between a first stop at the frontal housing end and a second stop remote therefrom, a tight connecting device formed inside the housing between the frontal housing end and the adjusting device, and a connecting channel extending from the first stop to the second stop at the guide section. A contiguous second inner region leads to minimal changes in the volume of the second inner region even during movements of the movable part.

14 Claims, 2 Drawing Sheets

(56) References Cited

U.S. PATENT DOCUMENTS

| | | | |
|---|---|---|---|
| 6,481,723 | B1 | 11/2002 | Hao et al. |
| 6,646,857 | B2 * | 11/2003 | Anderson ......... H01L 21/68742 |
| | | | 361/160 |
| 2006/0156981 | A1 | 7/2006 | Fondurulia et al. |
| 2007/0212200 | A1 | 9/2007 | Yamashita |
| 2008/0110397 | A1 | 5/2008 | Son |
| 2010/0187777 | A1 * | 7/2010 | Hao ................. H01L 21/68742 |
| | | | 279/142 |
| 2013/0059447 | A1 | 3/2013 | McMillin et al. |
| 2017/0032997 | A1 | 2/2017 | Willwerth et al. |
| 2017/0133260 | A1 | 5/2017 | Pohl et al. |
| 2018/0108559 | A1 | 4/2018 | Balan et al. |
| 2018/0130677 | A1 | 5/2018 | Terufumi et al. |

FOREIGN PATENT DOCUMENTS

| | | |
|---|---|---|
| EP | 3361316 A1 | 8/2018 |
| JP | 2007250796 A | 9/2007 |
| JP | 2007273685 A | 10/2007 |
| JP | 2008112801 A | 5/2008 |
| JP | 2008270721 A | 6/2008 |
| JP | 201034208 A | 12/2010 |
| JP | 2012516563 A | 7/2012 |
| JP | 201728248 A | 2/2017 |
| KR | 1020080018923 | 2/2008 |
| KR | 20100117924 A | 11/2010 |
| TW | 527628 B | 4/2003 |
| TW | 200822274 A | 5/2008 |
| WO | 2001069660 A2 | 9/2001 |
| WO | 2006078585 A2 | 7/2006 |
| WO | 2008029608 A1 | 3/2008 |

* cited by examiner

PIN LIFTING DEVICE

The present application claims priority to International Application No. PCT/EP2019/074610, filed Sep. 16, 2019, and German Patent application 10 2018 007 307.7 filed Sep. 17, 2018, each of which are herein incorporated by reference in their entirety.

The invention relates to a pin lifting device for moving and positioning a substrate in a process chamber by means of at least one support pin.

Pin lifting devices, also known as pin lifters, are typically designed and provided for the reception and defined positioning of a substrate to be processed in a process chamber. These are used in particular for vacuum chamber systems in the area of IC, semiconductor, flat panel or substrate production, which must take place in a protected atmosphere without the presence of contaminating particles.

Such vacuum chamber systems comprise in particular at least one evacuatable vacuum chamber which is provided for receiving semiconductor elements or substrates to be processed or produced and which has at least one vacuum chamber opening through which the semiconductor elements or other substrates can be guided into and out of the vacuum chamber. For example, in a production plant for semiconductor wafers or liquid crystal substrates, the highly sensitive semiconductor or liquid crystal elements pass sequentially through several process vacuum chambers in which the parts located within the process vacuum chambers are each processed by means of a processing device.

Such process chambers often have at least one transfer valve whose cross-section is adapted to the substrate and the robot and through which the substrate can be introduced into the vacuum chamber and, if necessary, removed after the intended processing. Alternatively, a second transfer valve may be provided for example through which the processed substrate is removed from the chamber.

The substrate, e.g. a wafer, is guided, for example, by a suitably designed and controlled robot arm, which can be passed through the opening in the process chamber provided by the transfer valve. The process chamber is then loaded by gripping the substrate with the robot arm, placing the substrate in the process chamber and depositing the substrate in the chamber in a defined manner. The process chamber is emptied accordingly.

For the placement of the substrate and for the exact positioning of the substrate in the chamber, a relatively high accuracy and mobility of the substrate must be ensured. For this purpose, pin lifting systems are used which provide a plurality of support points for the substrate and thus a load distribution (due to the dead weight of the substrate) over the entire substrate.

For example, the substrate is positioned by the robot above the support pins of the lifting device and placed on the pins. After the robot has moved away, the substrate is deposited by lowering the pins on a carrier, e.g. a potential plate or chuck (a device for fixing a substrate firmly during the machining process (clamping means)), and the robot arm, which typically carries the substrate, is moved out of the chamber, e.g. before lowering the pins. The pins can be lowered further after depositing the substrate and are then separated from it, i.e. there is no contact between the pins and the substrate. Alternatively, the support pins can remain in contact with the substrate. After removing the robot arm and closing (and introducing process gas or evacuating) the chamber, the processing step is performed.

At the same time, the gentlest possible and careful treatment of the substrates to be processed and the shortest possible processing time should be provided. This means that the substrate can be brought into the defined states—loading and unloading position and processing position—in the chamber as quickly as possible.

To avoid unwanted shocks during the processing of semiconductor wafers, for example, U.S. Pat. No. 6,481,723 B1 proposes the use of a special stop device instead of hard motion stops in a pin lifter. Here, hard plastic stops are to be replaced by a combination of a softer designed stop part and a hard stop, wherein contact is first made with the soft stop part to limit the movement and the hard stop is then brought into contact with the soft stop part in a correspondingly damped manner.

U.S. Pat. No. 6,646,857 B2 proposes a regulation of the lifting movement by means of a detected occurring force. The lifting pins can be moved as a function of the force signal received so that the lifting force at the lifting pins is always appropriately dosed and controlled on the wafer.

With each processing cycle, the support pin (pin) of a pin lifting device (pin lifter) is brought into contact with the substrate to be picked up and released from it. In this case, the support pin is moved outwards and inwards relative to the housing by a drive device arranged on a housing through a housing opening of a housing end arranged at a first face end region of the housing.

Bearings and lubricants adapted to the movement are used to ensure the movement of the support pin and a movable part of the pin lifting device that holds said movable part over a long period of time. The movement of the movable part in a housing leads to changes in the free interior space of the housing, wherein the free volumes of two partial spaces disposed on both sides of the movable part in the direction of movement change. Volume changes in a closed housing result in pressure changes that can affect the exact movement or positioning of the support pin. If the housing is not tightly sealed, volume changes will cause air or gas to move out of and into the housing. Particles, especially particles of the lubricant, can escape from the housing and possibly reach the nearby process chamber.

It is therefore the object of the present invention to provide an improved pin lifting device which reduces or avoids the above disadvantages.

In particular, it is the object of the invention to provide an improved pin lifting device in which the movement of the support pins is carried out as undisturbed as possible and from which no particles can enter the process chamber.

These objects are solved by the realization of the characterizing features of claim 1. Features which further develop the invention in an alternative or advantageous way can be found in the dependent claims.

A pin lifting device according to the invention is designed to move and position a substrate to be processed in a process atmosphere area provided by a vacuum process chamber. The pin lifting device comprises a housing extending along an adjustment axis, a frontal housing end with a housing opening arranged at a first end region of the housing, a drive part arranged at a second end region of the housing, an adjusting device with a part movable in the housing in the direction of the adjustment axis, an inner guide section for the adjusting device formed on the housing between a first stop at the frontal housing end and a second stop remote therefrom, and a coupling leading from the adjusting device through the housing opening for carrying a support pin. A tight connecting device formed within the housing between the frontal housing end and the adjusting device is formed and fixed to the housing end and to the adjusting device in such a way that access through the housing opening leads only into a first inner region closed off by the tight connecting device and the adjusting device. A connecting channel extends from the first stop to the second stop at the guide section, thereby ensuring the connection of a second inner region between the housing, the housing end, the connecting device, the adjusting device and the drive part.

The sealed connection device ensures that no particles can enter the process chamber. The contiguous second inner region leads to minimal changes in the volume of this second inner region even during movements of the movable part and ensures that the movement of the support pins can be carried out essentially undisturbed.

The adjusting device, which is mounted in the housing and movable in the direction of the adjustment axis, comprises a movable part in the housing. The movable part preferably comprises a sleeve-shaped section, the outer shape of which is adapted as a guide section to the inner shape of the housing. The end faces formed on both sides of the sleeve-shaped section in the direction of the adjustment axis are in contact with the associated stop faces of the housing at the first and second stop.

Since the housing opening of the pin lifting device opens into the process chamber and the process chamber must be tightly sealable, a tight connecting device is inserted between the housing opening and the adjusting device connected to the support pin. In the adjusting device, the tight connecting device is fixed to the movable part, preferably to the sleeve-shaped section. A particularly suitable connecting device comprises a bellows-shaped sealing element which is tightly connected to the housing opening and to the adjusting device, in particular to the movable part of the adjusting device, and which permits the desired movements of the support pin.

The connecting device is designed in such a way that only access to an area bounded by the connecting device and the movable part is possible through the opening in the housing. The remaining interior of the housing is tightly separated from this first interior by the connecting device. The movable part of the adjusting device is displaceably mounted in the housing and divides the second inner region, which is bounded by the housing, the connecting device and the movable part, into two compartments. A connecting channel between these two sections reduces pressure fluctuations and associated disturbances.

In a preferred embodiment, the connecting device separates the first inner region in a gas-tight manner from the second inner region and the second inner region is separated from the environment in a gas-tight manner by the elements surrounding it, wherein the second inner region optionally comprises an equalizing opening.

In an advantageous embodiment, the pin lifting device has a blocking device arranged at the equalizing opening of the second inner region, which at least restricts the escape of particles into the environment.

In a first embodiment of the blocking device, this comprises an equalizing opening from the second inner region into the environment and, in this equalizing opening, a filter, wherein the outlet through the equalizing opening is only possible via the passage through the filter. For this purpose, at least one extension of the filter is adapted to the corresponding extension of the receiving area for the filter, so that a tight connection is ensured between the receiving area and the filter with regard to the flow through the filter. Optionally, a seal is inserted between the receiving area and the filter in a ring area leading around the passage area.

By selecting the appropriate filter, it can be ensured that essentially no particles, in particular no solid fractions of lubricants, can escape from the second inner region into the environment. The filter can be designed as a simple porous element, preferably as a sintered filter. In particular, the filter is manufactured by sintering. It is preferably made of metal, ceramic or PTFE.

In another embodiment of the blocking device, it comprises a equalizing opening from the second internal part to a pipe connected to a compensation vessel. Thus the gas, which is located in the second inner region with the movable part, is always in a gas-tight space sealed against the environment. A filter can therefore be dispensed with in this embodiment. Optionally, the compensation vessel is flexibly designed so that, when the movable part moves, gas escaping from the housing with particles can be absorbed in the compensation vessel without build-up of a significant overpressure or gas entering the housing can flow back from the compensation vessel without a significant underpressure.

In a further embodiment of the blocking device, it comprises an equalizing opening from the second inner region to a line via which a desired pressure, preferably a vacuum, can be built up in the second inner region. A desired vacuum can be achieved with a pump or vacuum source. If necessary, a protective gas is introduced into the second inner region via the line.

In a preferred embodiment, a valve is connected to the equalizing opening, which makes a connection to the compensation vessel, the vacuum pump or the protective gas source adjustable. Optionally, the valve can be connected either to the compensation vessel or to a connection to the environment terminated with a filter.

The arrangement of the blocking device on the housing separates the exchange between the second inner region with the movable part and the surroundings of the pin lifting device for unwanted particles and/or gases. The use of this pin lifting device is possible in a clean room without any problems.

In a preferred embodiment, a slide is assigned to the movable part, which is coupled to a threaded rod of the drive unit and can be moved linearly along the threaded rod.

In another embodiment, the adjusting device is moved by a push rod of a lifting cylinder.

The drive unit can also have a controllable electric motor which is coupled to the threaded rod and provides rotation of the threaded rod during operation, especially around the adjustment axis. The pin lifting device can thus be realized as a mechatronic pin lifting device.

When the rotation of the threaded rod is provided by means of an electric motor, a linear movement of the slide, the movable part and thus the support pin can take place through the interaction of the threaded rod and slide.

The number of movable parts and the masses to be moved can be kept relatively low by an embodiment with a slide. The pin lifting device can thus be operated comparatively quickly and efficiently, i.e. a wafer can be raised or lowered quickly and precisely at the same time.

The slide preferably has an internal thread which corresponds to the thread of the threaded rod. In addition, the slide can be provided in the pin lifting device in such a way that, for example, it is mounted non-rotatably by means of a linear guide (e.g. groove) and thus only has a translatory degree of freedom of movement. By limiting the degrees of freedom of the slide, it can be moved linearly and positioned with high precision by rotating the threaded rod. Such a design can also absorb and counteract comparatively large forces acting parallel to the adjustment axis in the direction of the drive, e.g. forces due to the dead weight of a substrate to be processed.

In an advantageous embodiment, the linear guide comprises a longitudinal groove and an engagement element standing in the longitudinal groove. The interaction of longitudinal groove and engagement element reduces the movement of the movable part to a torsion-free longitudinal displacement of the movable part in the housing. The longitudinal groove may also be used as a connecting channel between the compartments inside the housing, separated from each other by the movable part of the adjusting device. The longitudinal groove is preferably formed on the inside of the housing and a feather key is inserted on the movable part, which is guided in the longitudinal groove and thereby ensures the protection from torsion. As the feather key does not completely close the passage in the groove direction, the longitudinal groove is also available as a connecting channel between the first and second stop and thus between the compartments, wherein the channel cross-section available for the feather key is slightly reduced.

In another embodiment, the drive unit can have a pneumatic drive cylinder which is coupled to the adjusting device. The pneumatic drive cylinder can cause a linear movement of the adjusting device and can preferably be connected to a push element, e.g. push rod.

The devices according to the invention are described merely by way of example in more detail below by means of concrete embodiment examples schematically shown in the drawings, wherein further advantages of the invention are also discussed, with the figures showing in detail:

Figure 1:
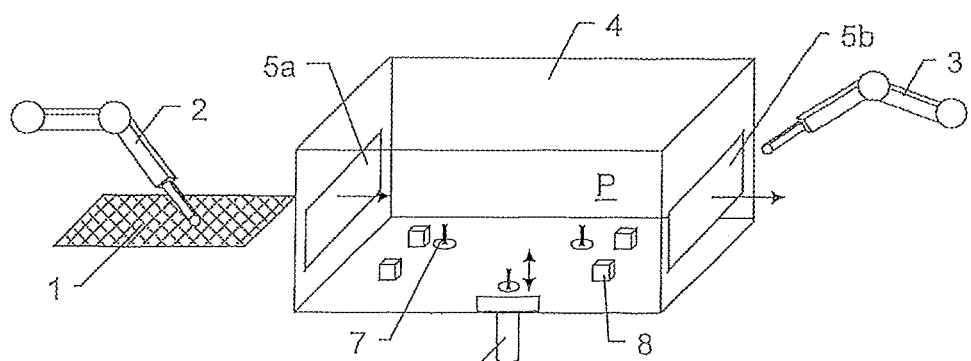
FIG. 1 shows a schematic representation of an embodiment of a vacuum processing device for a wafer with a pin lifting device.
Figure 2:
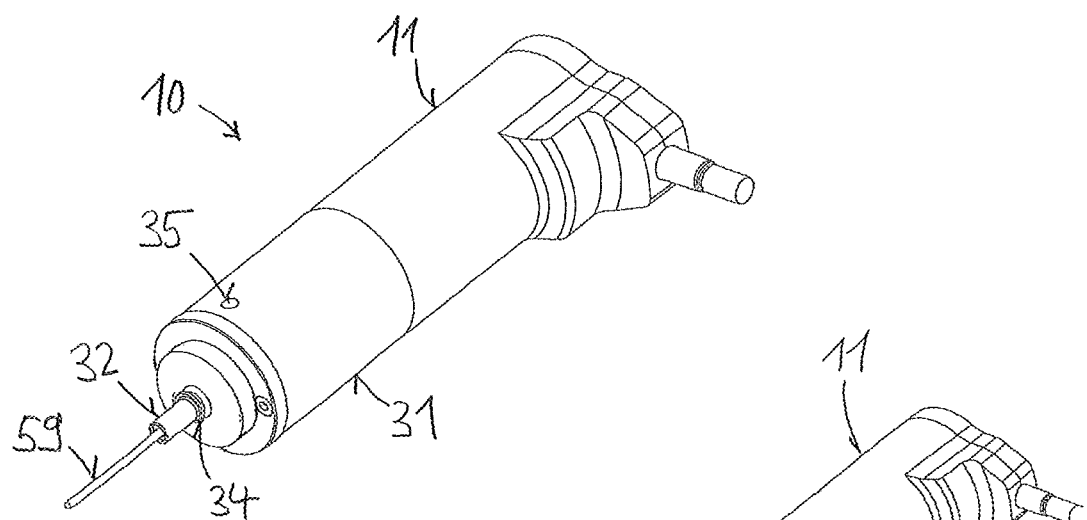
FIG. 2 shows a perspective view of a pin lifting device.
Figure 3:
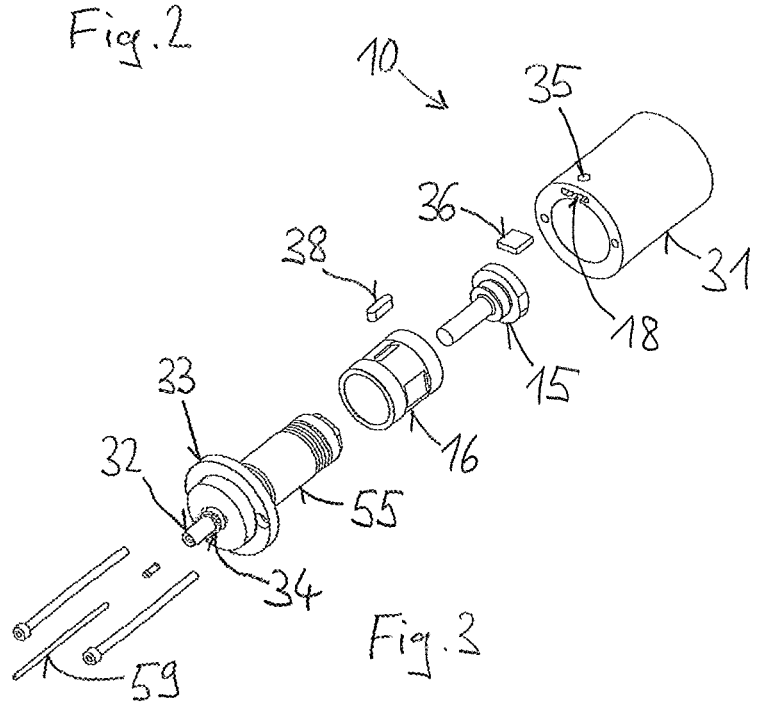
FIG. 3 shows an exploded view of a pin lifting device.

FIG. 1 schematically shows a process setup for processing a semiconductor wafer 1 under vacuum conditions. The wafer 1 is inserted into a vacuum chamber 4 (process atmosphere area P) by means of a first robot arm 2 through a first vacuum transfer valve 5a and brought into position by means of support pins 7 of pin lifting devices in accordance with the invention. The wafer 1 is then picked up or deposited by means of the support pins 7 and the robot arm 2 is moved away. The wafer 1 typically rests on the robot arm or a support device provided on the robot arm 2, 3 or is held by a specific support device. After wafer 1 has been picked up by pins 7, the robot arm is guided out of chamber 4, transfer valve 5a is closed and pins 7 are lowered. This is done by means of the drives 6 of the pin lifting devices which are coupled to the respective pins 7. The wafer 1 is thereby placed on the four support elements 8 shown.

In this state, a planned processing (e.g. coating) of the wafer 7 takes place under vacuum conditions and especially in a defined atmosphere (i.e. with a certain process gas and under defined pressure). Chamber 4 is coupled with a vacuum pump and preferably with a vacuum control valve for controlling the chamber pressure (not shown).

After processing, the wafer 1 is lifted into a removal position again by means of the pin lifting devices. With the second robot arm 3, wafer 1 is subsequently removed through the second transfer valve 5b. Alternatively, the process can be designed with only one robot arm, with loading and unloading then taking place via a single transfer valve.

FIGS. 2 to 5 show an embodiment of a pin lifting device 10 according to the invention. The pin lifting device 10 has a lower drive part 11, shown only schematically, which preferably comprises a drive unit designed as an electric motor. In the embodiment shown, the motor drives a threaded rod 13. The threaded rod 13 can be rotated around its axis by actuating the motor accordingly.

A slide 14 interacts with the threaded rod 13 and can be moved linearly along a central adjustment axis A by rotating the threaded rod 13. The slide 14 has an internal thread which corresponds to the thread of the threaded rod 13. The slide 14 and a guide sleeve 16 belong to an adjusting device 15, which is mounted in such a way that it cannot be rotated relative to the pin lifting device 10 itself, but can only be moved in the directions of movement parallel to the adjustment axis A.

The adjusting device 15 comprises a movable part 21 relative to the drive part 11. This movable part 21 can be moved and positioned linearly by the slide 14. In a special embodiment, the movable part 21 is manufactured in such a way that it is unable to provide electrical conductivity. In particular, the movable part 21 is made of an electrically non-conductive material, e.g. plastic, or coated with a non-conductive material.

The drive part 11 is firmly connected to a housing 31 of the pin lifting device 10 which extends along the adjustment axis A. At the end of the housing 31 remote from the drive part 11 there is a housing end 33 on the end face. On the inside of the housing 31, a guide section 17 is designed for a guide sleeve 16 of the adjusting device 15 adapted to it. In an advantageous embodiment, the guide sleeve 16 and the guide section 17 have a circular-cylindrical contact region.

The guide section 17 extends from a first stop 17a at the front end of the housing end 33 to a second stop 17b at the drive part 11 facing away from it. The guide sleeve 16 is thus guided between the two stops 17a and 17b so that it can be displaced in the direction of the adjustment axis A.

A housing opening 34 is formed in the end face of the housing end 33 through which a free end of a coupling 32 attached to the movable part 21 can emerge from the housing 31. A support pin 59 can be used at the free end of coupling 32. A sealed connecting device 55 formed within the housing 31 between the housing end 33 and the adjusting device 15 is so formed and secured to the housing end 33 and to the adjusting device 15 that access between the housing opening 34 and the free end of the coupling 32 into the housing 31 leads only into a first inner region completely closed off from the sealed connecting device 55 and the adjusting device 15. The connecting device 55 is designed so that the movement of the adjusting device 15 relative to the housing end 33 is not impaired. Because it has to take different lengths for this purpose, it preferably includes at least one bellow-shaped area.

A connecting channel 18 extends from the first stop 17a to the second stop 17b at guide section 17 between the adjusting device 15 or the guide sleeve 16 and the housing 31. The connecting channel 18 ensures the connection of a second inner region between the housing 31, the housing end 33, the connecting device 55, the adjusting device 15 and the drive unit 11, even with a sealing guidance between the guide section 17 and the guide sleeve 16. In an advantageous embodiment, the connecting channel 18 is designed as a longitudinal groove on the inside of the housing 31.

The connecting device 55 separates the first inner region from the second inner region, in particular in a gas-tight manner.

If the guide sleeve 16 is at the first stop 17*a*, the second inner region essentially consists of a first compartment 19*a* between the adjusting device 15 and the drive unit 11. If the guide sleeve 16 is at the second stop 17*b*, the second inner region essentially consists of a second compartment 19*b* between the connecting device 55 and the housing 31. If the guide sleeve 16 is in positions between the two stops 17*a* and 17*b*, the two existing compartments 19*a* and 19*b* are connected to each other via the connecting channel 18. This connection reduces the volume change in the connected second inner region caused by the movement of the adjusting device 15.

With decreasing diameter of the connecting device 55 and increasing wall thickness of the guide sleeve 16, the volume change resulting from the movement of the adjusting device 15 can be reduced. If the volume change during the movement between the two stops 17*a* and 17*b* is small, the contiguous second inner region can be closed to the environment, especially gas-tight. The lubricant entering this second inner region from the drive unit 11 and/or from the guide section 17 with the guide sleeve 16 of the adjusting device 15 is then absorbed in a closed inner region and cannot enter the environment.

Alternatively, in particular if the change in volume during the movement between the two stops 17*a* and 17*b* is large, the contiguous second inner region can be connected to the environment via a compensation opening 35, wherein a filter 36 is then arranged at or in the compensation opening 35, so that substantially no particles can escape into the environment. The compensation opening 35 preferably connects to the connecting channel 18.

Figure 6:
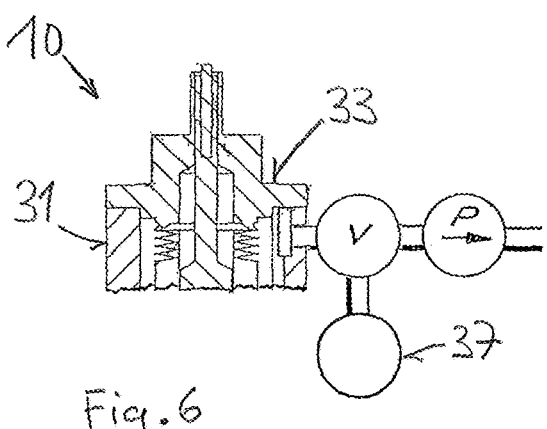
FIG. 6 shows a section of a longitudinal section through a pin lifting device with a valve, a compensation vessel and a pump.

FIG. 6 illustrates embodiments in which the contiguous second inner region can be connected to a compensation vessel 37 or to a vacuum pump P via the compensation opening 35. Optionally, only one of these two variants is provided, but preferably a valve V is used to adjust one of the two variants. A filter 36 is not required for the connection to the compensation vessel 37. When connecting to a vacuum pump, it may be advantageous to insert a filter 36 in the connection to the vacuum pump.

The adjusting device 15 has a movable coupling 32 which is designed at one free end to accommodate a support pin 59. In the example shown, the coupling 32 essentially extends along the adjustment axis A. The coupling 32 is connected to the movable part 21. For this purpose, the coupling 32 has an inner recess in which the movable part 21 is received and fixed, e.g. by means of an adhesive bond or screw connection.

The connections between the slide 14, the movable part 21 and the coupling 32 allow the coupling 32 to be moved controllably by a motor and thus provide a support pin 59 accommodated in the coupling 32.

The connecting channel 18 is preferably designed as a longitudinal groove on the inside of the housing 31. A feather key 38 is arranged on the guide sleeve 16, preferably inserted into a receiving bore. The feather key 38 is guided in the longitudinal groove and ensures protection from torsion. As the feather key 38 leaves a passage free in the longitudinal groove for the connecting channel 18, the longitudinal groove is also available as connecting channel 18 between the first and second stops 17*a* and 17*b* and thus between the compartments 19*a* and 19*b*, wherein the available channel cross-section of the feather key 38 is slightly reduced.

Figure 4:
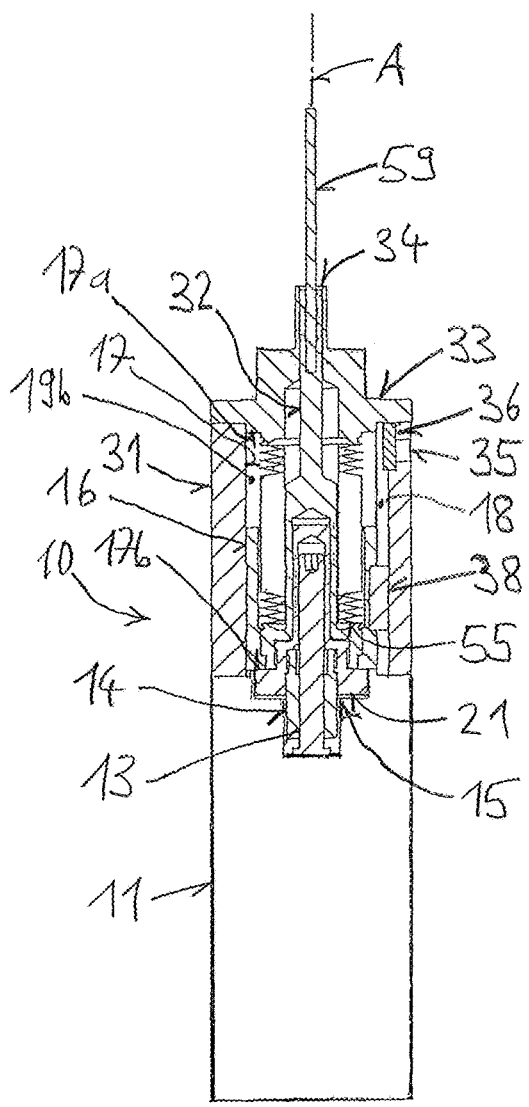
FIG. 4 shows a longitudinal section through a pin lifting device in the position with the pin retracted.

FIG. 4 shows the coupling 32 of the pin lifting device 10 in a lowered normal position in which the support pin 59 preferably has no contact with a substrate to be processed.

Figure 5:
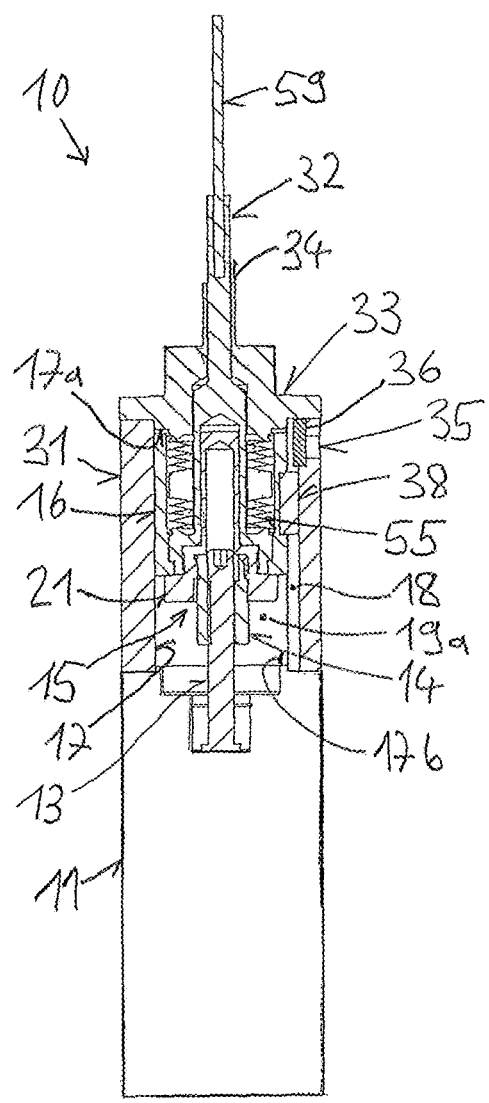
FIG. 5 shows a longitudinal section through a pin lifting device in the position with the pin extended.

FIG. 5 shows the coupling 32 of the pin lifting device 10 in an extended support position in which the pin 59 provides its intended effect of picking up, moving and/or making the substrate available.

To reach the extended support position, a motor can be actuated accordingly. For this purpose, for example, a running time of the motor or a number of rotations to be carried out for the threaded rod 13 can be stored in order to set a desired position for the slide 14. In particular, an encoder is coupled to the motor in order to make the movements of the motor axis supervisable and controllable.

The movable part 21 in the embodiment shown is sleeve-shaped and comprises a recess for receiving one end area of the threaded rod 13.

It is understood that the figures shown only schematically represent possible embodiment examples. The different approaches can be combined according to the invention with each other as well as with devices for substrate movement in vacuum process chambers, especially pin lifting devices 10, of the prior art.

The invention claimed is:

1. A pin lifting device configured to move and position a substrate to be processed, in a process atmosphere region provided by a vacuum process chamber, comprises:
   a housing which extends along an adjustment axis, a frontal housing end which is arranged at a first end region of the housing and has a housing opening, and a drive part which is arranged at a second end region of the housing, an adjusting device having a part movable in the housing in a direction of the adjustment axis, a guide section for the adjusting device formed internally on the housing between a first stop at the frontal housing end and a second stop remote therefrom, a coupling leading from the adjusting device through the housing opening for carrying a support pin, wherein
   a tight connecting device which is formed inside the housing between the frontal housing end and the adjusting device and which is formed and fastened to the frontal housing end and to the adjusting device in such a way that access through the housing opening leads only into a first inner region which is closed off by the tight connecting device and the adjusting device, and
   a connecting channel extending from the first stop to the second stop at the guide section and ensuring the connection of a second inner region between the housing, the frontal housing end, the connecting device, the adjusting device and the drive part.

2. The pin lifting device according to claim 1, wherein the adjusting device is adjustably guided on the guide section by means of a guide sleeve.

3. The pin lifting device according to claim 2, wherein the guide sleeve and the guide section have a circular-cylindrical contact region.

4. The pin lifting device according to claim 1, wherein the tight connecting device comprises a bellows-shaped sealing element.

5. The pin lifting device according to claim 1, wherein the connecting channel is formed as a longitudinal groove on an inside of the housing.

6. The pin lifting device according to claim 5, wherein a feather key, which is guided in the longitudinal groove, is arranged on the part movable in the housing, wherein the feather key leaves a passage free in the longitudinal groove for the connecting channel.

7. The pin lifting device according to claim 1, wherein a compensation opening adjoins the second inner region.

8. The pin lifting device according to claim 7, wherein the compensation opening adjoins the connecting channel.

9. The pin lifting device according to claim 7, wherein a filter is disposed at the compensation opening which reduces an escape of particles into an environment.

10. The pin lifting device according to claim 7, wherein the compensation opening is connected to a compensation container or to a vacuum pump, via an adjustable valve.

11. The pin lifting device according to claim 1, wherein the drive part comprises a threaded rod and the adjusting device comprises a slide, wherein the slide is coupled to the threaded rod and is linearly movable along the threaded rod.

12. The pin lifting device according to claim 11, wherein the drive part has a controllable electric motor which is coupled to the threaded rod and in operation provides rotation of the threaded rod.

13. The pin lifting device according to claim 1, the drive part comprises a drive cylinder coupled to the adjusting device.

14. The pin lifting device according to claim 1, wherein the tight connecting device separates the first inner region from the second inner region.

* * * * *